United States Patent [19]
Olson

[11] Patent Number: 6,075,249
[45] Date of Patent: Jun. 13, 2000

[54] METHODS AND APPARATUS FOR SCANNING AND FOCUSING AN ION BEAM

[75] Inventor: Joseph C. Olson, Beverly, Mass.

[73] Assignee: Varian Semiconductor Equipment Associates, Inc., Gloucester, Mass.

[21] Appl. No.: 09/100,927

[22] Filed: Jun. 19, 1998

[51] Int. Cl.[7] .................. H01J 3/14; H01J 3/26
[52] U.S. Cl. .................. 250/396 R; 250/492.21
[58] Field of Search .................. 250/396 R, 492.21, 250/492.3

[56] References Cited

U.S. PATENT DOCUMENTS

| | | | |
|---|---|---|---|
| 4,276,477 | 6/1981 | Enge | 250/398 |
| 4,283,631 | 8/1981 | Turner | 250/492 B |
| 4,851,693 | 7/1989 | Fisher | 250/492.3 |
| 4,899,059 | 2/1990 | Freytsis et al. | 250/492.2 |
| 4,922,106 | 5/1990 | Berrian et al. | 250/492.2 |
| 5,126,575 | 6/1992 | White | 250/492.3 |
| 5,350,926 | 9/1994 | White et al. | 250/492.21 |

FOREIGN PATENT DOCUMENTS

| | | |
|---|---|---|
| 0 451 907 A1 | 10/1991 | European Pat. Off. . |
| 0 621 572 4 | 8/1994 | Japan . |
| 0 810687 7 | 4/1996 | Japan . |

*Primary Examiner*—Teresa M. Arroyo
*Assistant Examiner*—Nikita Wells
*Attorney, Agent, or Firm*—Wolf, Greenfield & Sacks, P.C.

[57] ABSTRACT

Methods and apparatus are provided for scanning and focusing a charged particle beam, such as an ion beam. The apparatus includes a charged particle source for generating a charged particle beam, scan electrodes disposed on opposite sides of the charged particle beam and a postscan electrode disposed adjacent to the charged particle beam and downstream of the scan electrodes. A postscan voltage is applied to the postscan electrode. A scan voltage generator applies to the scan electrodes scan voltages for scanning the charged particle beam in a first direction. The scan voltages have negative DC voltage offsets which are preferably more negative than the postscan voltage. The charged particle beam is focused in a second direction orthogonal to the first direction. The invention may be used in an ion implanter to increase the ion beam current delivered to a target.

27 Claims, 6 Drawing Sheets

METHODS AND APPARATUS FOR SCANNING AND FOCUSING AN ION BEAM

FIELD OF THE INVENTION

This invention relates to methods and apparatus for controlling a charged particle beam and, more particularly, to methods and apparatus for scanning and focusing an ion beam in an ion implanter.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. Examples of prior art ion implanters are disclosed in U.S. Pat. No. 4,276,477 issued Jun. 30, 1981 Enge; U.S. Pat. No. 4,283,631 issued Aug. 11, 1981 to Turner; U.S. Pat. No. 4,899,059 issued Feb. 6, 1990 to Freytsis et al; and U.S. Pat. No. 4,922,106 issued May 1, 1990 Berrian et al.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined, at least in part, by the energy of the ions implanted into the semiconductor wafer. Shallow junctions are obtained with low implant energies. Ion implanters are typically designed for efficient operation at relatively high implant energies, for example in the range of 50 keV to 400 keV, and may not function efficiently at the energies required for shallow junction implantation. At low implant energies, the current delivered to the wafer is much lower than desired and in some cases may be near zero. As a result, extremely long implant times are required to achieve a specified dose, and throughput is adversely affected. Such reduction in throughput increases fabrication cost and is unacceptable to semiconductor device manufacturers.

Semiconductor device manufacturers typically require the use of parallel scan techniques, wherein the ion beam has a constant angle of incidence on the semiconductor wafer. One known technique for achieving parallel scanning involves deflection of the ion beam with a magnetic or electrostatic scanner to form a fan-shaped beam. The scanner is followed by an angle corrector, which deflects the fan-shaped beam into parallel trajectories to form a scanned ion beam. The scanned ion beam is distributed over the semiconductor wafer by mechanically moving the wafer in a direction perpendicular to the plane of the scanned ion beam.

The angle corrector typically comprises a pair of magnetic polepieces spaced apart by a relatively small dimension in the direction perpendicular to the scanned ion beam. The magnetic fields produced by the angle corrector deflect the ion beam in the scanning plane to produce parallel trajectories. At low ion beam energies, the ion beam tends to expand due to the well-known space charge effect, and a portion of the ion beam may be incident on the polepieces of the angle corrector, thereby reducing the current delivered to the semiconductor wafer. In addition to the above problems associated with reduced beam current and extended implant times, contaminants may be generated through sputtering when energetic ions impinge on surfaces along the beamline. The spacing between the polepieces of the angle corrector cannot be increased without degrading the performance of the angle corrector.

Accordingly, there is a need for improved methods and apparatus for controlling an ion beam to alleviate one or more of the above-described disadvantages, without substantial impact on the size and cost of the ion implanter.

SUMMARY OF THE INVENTION

According to a first aspect of the invention, apparatus is provided for controlling a charged particle beam, such as ion beam. The apparatus comprises a charged particle source for generating a charged particle beam, scan electrodes disposed on opposite sides of the charged particle beam and a postscan electrode disposed adjacent to the charged particle beam and downstream of the scan electrodes. A postscan voltage is applied to the postscan electrode. A scan voltage generator applies to the scan electrodes scan voltages for scanning the charged particle beam in a first direction. The scan voltages have negative DC voltage offsets. The charged particle beam is focused in a second direction orthogonal to the first direction. The apparatus may be used in an ion implanter to increase the ion beam current delivered to a target.

The scan electrodes may comprise first and second scan plates positioned on opposite sides of the charged particle beam in the first direction. The scan plates may comprise parallel portions and diverging portions downstream of the parallel portions.

The postscan electrode may comprise first and second electrode portions positioned on opposite sides of the charged particle beam in the second direction. The postscan electrode may define a generally rectangular aperture having a long dimension parallel to the first direction. The apparatus may further comprise a postscan voltage generator for applying the postscan voltage to the postscan electrode. The postscan voltage may be selected to suppress migration of electrons from the charged particle beam toward the scan electrodes.

The scan voltages may comprise sawtooth waveforms for scanning the charged particle beam in the first direction. The sawtooth waveforms may have negative DC voltage offsets. The DC voltage offsets are preferably more negative than the postscan voltage. In one embodiment, the postscan voltage and the DC voltage offsets of the scan voltages differ by about 1 kilovolt to about 10 kilovolts. The apparatus may include means for adjusting the DC voltage offsets of the scan voltages as the energy of the charged particle beam is changed.

The apparatus may further comprise an angle corrector located downstream of the postscan electrode for converting the charged particle beam into substantially parallel trajectories, and means for adjusting the DC voltage offsets of the scan voltages, wherein the parallelism of the trajectories is adjusted.

According to another aspect of the invention, a method is provided for controlling a charged particle beam, such as an ion beam. The method comprises the steps of generating a charged particle beam, positioning scan electrodes on opposite sides of the charged particle beam and positioning a postscan electrode adjacent to the charged particle beam and downstream of the scan electrodes. A postscan voltage is applied to the postscan electrode. Scan voltages for scanning the charged particle beam in a first direction are applied to the scan electrodes. The scan voltages have negative DC voltage offsets, so that the charged particle beam is focused in a second direction orthogonal to the first direction.

BRIEF DESCRIPTION OF THE DRAWINGS

For a better understanding of the present invention, reference is made to the accompany drawings, which are incorporated herein by reference and in which.

DETAILED DESCRIPTION

Figure 1:
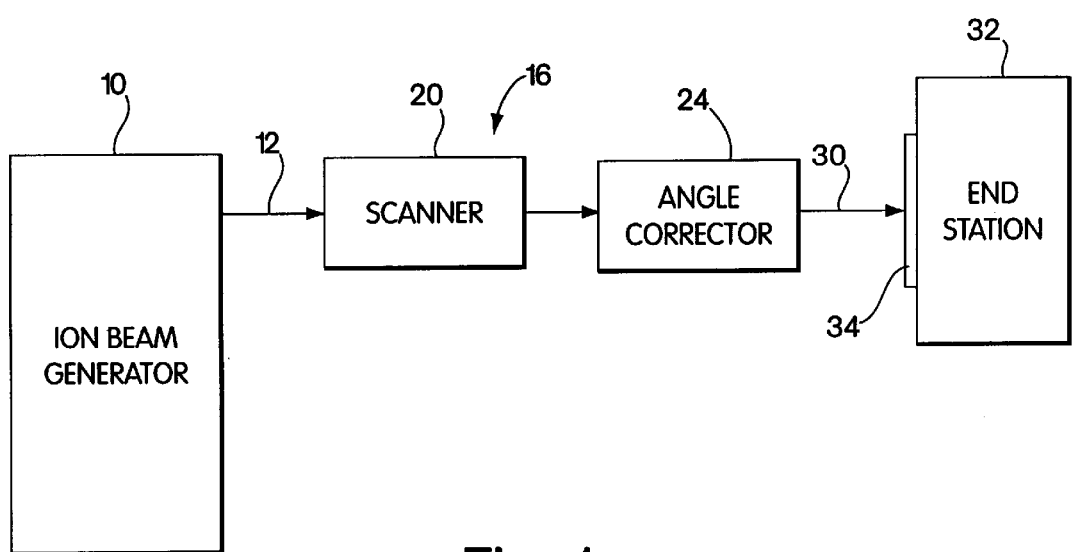
FIG. 1 is a simplified block diagram of an example of an ion implanter in accordance with the invention.

A simplified block diagram of an example of an ion implanter incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. A scanning system 16, which, for example, may include a scanner 20 and an angle corrector 24, deflects the ion beam 12 to produce a scanned ion beam 30. An end station 32 supports a semiconductor wafer 34 or other workpiece in the path of scanned ion beam 30 such that ions of the desired species are implanted into semiconductor wafer 34. The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

Figure 2:
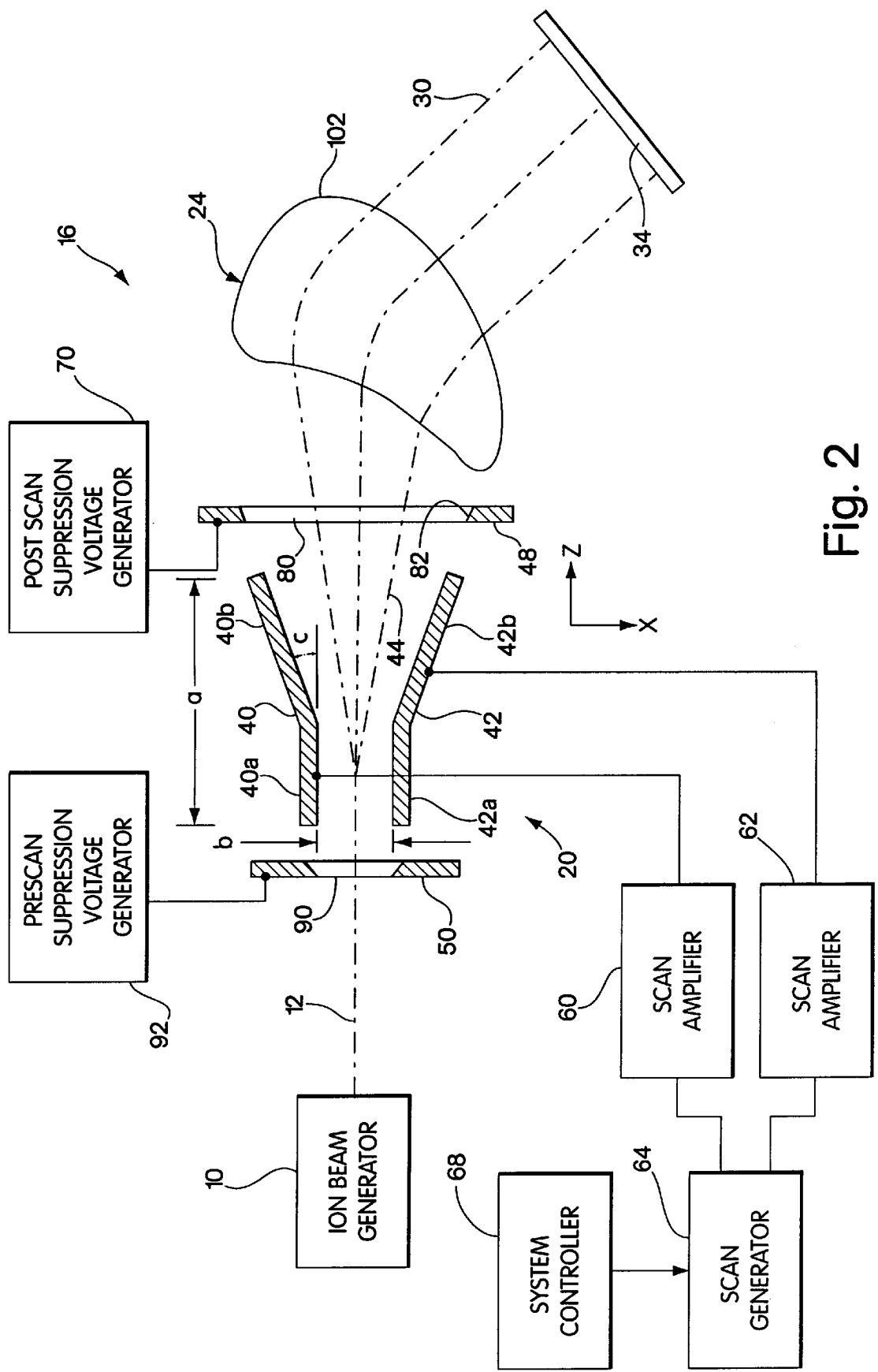
FIG. 2 is a schematic block diagram of an example of apparatus for scanning and focusing an ion beam in accordance with the invention, showing a top view of the beamline.
Figure 4:
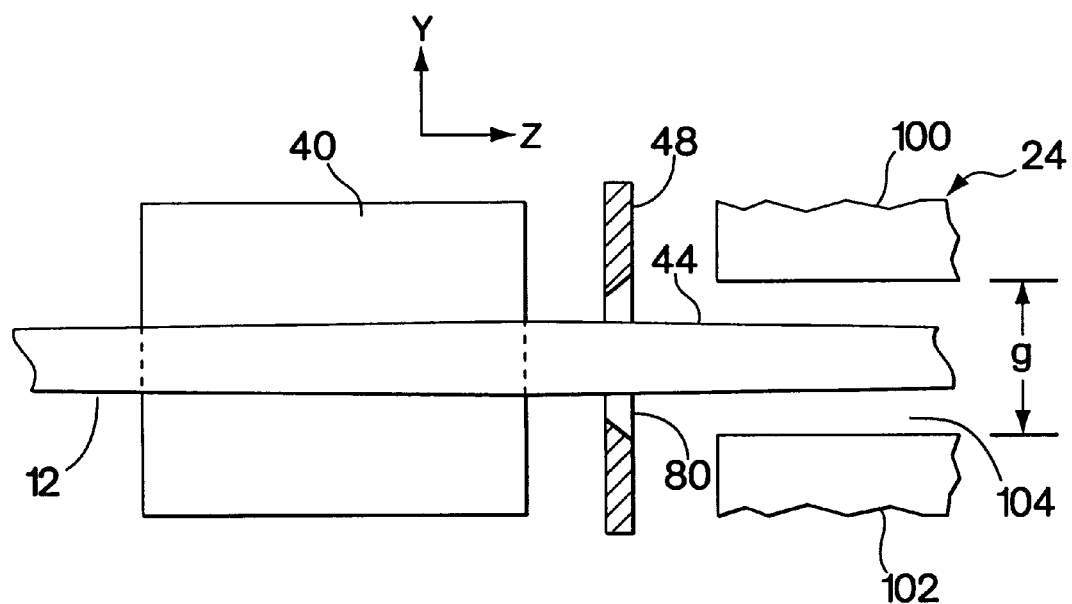
FIG. 4 is a partial side view of the scanning and focusing apparatus of FIG. 2.
Figure 5:
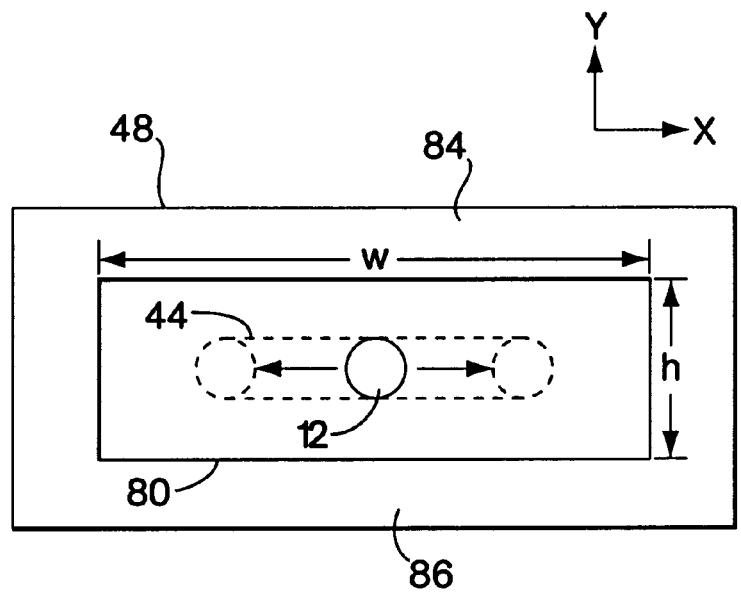
FIG. 5 shows the postscan electrode as viewed along the ion beam direction.
Figure 6:
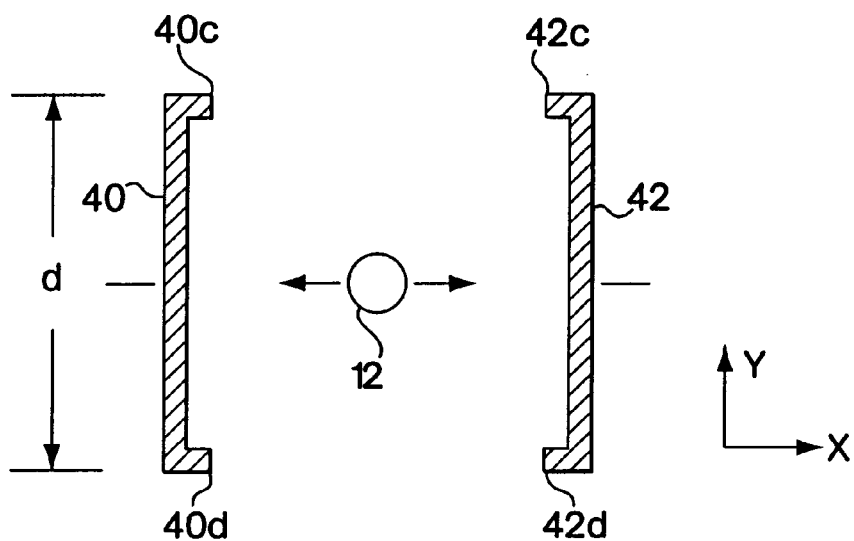
FIG. 6 is a cross section of the scan plates as viewed along the ion beam direction.

A schematic block diagram of an embodiment of scanning system 16 is shown in FIG. 2. Details of the scanning system are shown in FIGS. 4–6. Scanner 20 includes scan electrodes in the form of scan plates 40 and 42 positioned on opposite sides of ion beam 12. A postscan electrode 48 is positioned downstream of scan plates 40 and 42, and a prescan suppression electrode 50 may be positioned upstream of scan plates 40 and 42. Postscan electrode 48 may be used as a suppression electrode and is referred to herein as suppression electrode 48. However, it will be understood that electrode 48 is not required to function as a suppression electrode. As used herein, the terms "upstream" and "downstream" are referenced to the direction of ion beam transport. Thus, suppression electrode 48 is positioned between scan plates 40 and 42 and angle corrector 24, and suppression electrode 50 is positioned between scan plates 40 and 42 and ion beam generator 10.

In a preferred embodiment, scan plates 40 and 42 include parallel upstream plate portions 40a and 42a, and diverging downstream plate portions 40b and 42b. X, Y and Z reference directions are shown in FIGS. 2 and 4–6. In a preferred embodiment, scan plates 40 and 42 are disposed vertically, parallel to the Y direction, for scanning the ion beam 12 horizontally, in a plane parallel to the X direction. The scan plates may be shaped and spaced apart to provide electric fields suitable for scanning ion beam 12. A fan-shaped beam envelope 44 of the ion beam increases in width in the X direction as it passes through scan plates 40 and 42. Preferably, the scan plates 40 and 42 are shaped so as to maintain a relatively constant spacing from the beam envelope 44. As shown in FIG. 6, scan plate 40 may include flanges 40c and 40d that extend inwardly toward ion beam 12 from the upper and lower edges of scan plate 40. Similarly, scan plate 42 may include flanges 42c and 42d that extend inwardly toward ion beam 12 from the upper and lower edges of scan plate 42. Flanges 40c, 40d, 42c and 42d produce more uniform electric fields at the upper and lower edges of the region between scan plates 40 and 42.

Scan plate 40 is connected to a scan amplifier 60, and scan plate 42 is connected to a scan amplifier 62. Scan amplifiers 60 and 62 receive phased scan voltages from a scan generator 64. Scan generator 64 is controlled by a system controller 68, which may comprise a microcomputer. The system controller 68 may provide digital descriptions of the desired scan voltages to scan generator 64.

An embodiment of postscan suppression electrode 48 is shown in FIG. 5, as viewed along the direction of ion beam transport. Electrode 48 may comprise a conductive element having a rectangular aperture 80 for passage of ion beam 12. The dimensions of aperture 80 are selected to provide clearance for beam envelope 44 sufficient to minimize sputtering by ion beam 12 while controlling migration of electrons toward scan plates 40 and 42 from portions of ion beam 12 downstream of scanner 20. Preferably, aperture 80 is defined by knife edges 82, as shown in FIGS. 2 and 4, to minimize sputtering and wafer contamination. As best shown in FIG. 5, postscan suppression electrode 48 includes an upper electrode portion 84 above ion beam 12 in the Y direction and a lower electrode portion 86 below ion beam 12 in the Y direction. Postscan suppression electrode 48 may be connected to a postscan suppression voltage generator 70.

Prescan suppression electrode 50 may comprise a conductive element having an aperture 90 for passage of ion beam 12. Since ion beam 12 is not scanned at this point in the beamline, aperture 90 may have smaller dimensions than aperture 80 in postscan suppression electrode 48. Aperture 90 may be defined by knife edges to minimize sputtering and wafer contamination. The dimensions of aperture 90 are selected to provide clearance for ion beam 12 sufficient to minimize sputtering, while controlling migration of electrons toward scan plates 40 and 42 from portions of ion beam 12 upstream of scanner 20. Electrode 50 is connected to a prescan suppression voltage generator 92.

Angle corrector 24 may comprise a magnetic dipole for bending the trajectories of ions in beam envelope 44 to produce scanned beam 30 having parallel trajectories. As shown in FIGS. 2 and 4, angle corrector 24 may comprise an upper magnetic polepiece 100 positioned above beam envelope 44 and a lower magnetic polepiece 102 positioned below beam envelope 44. Polepieces 100 and 102 are shaped to bend the ion beam trajectories to produce scanned ion beam 30 having parallel trajectories. Polepieces 100 and 102 are energized by electromagnets (not shown). The design and construction of angle correctors using magnetic dipoles is known to those skilled in the art and is outside the scope of the present invention. The ion beam 12 passes through a gap 104 between polepieces 100 and 102. The gap 104 may, for example, have a vertical dimension g on the order of about 60 millimeters.

Figure 3:
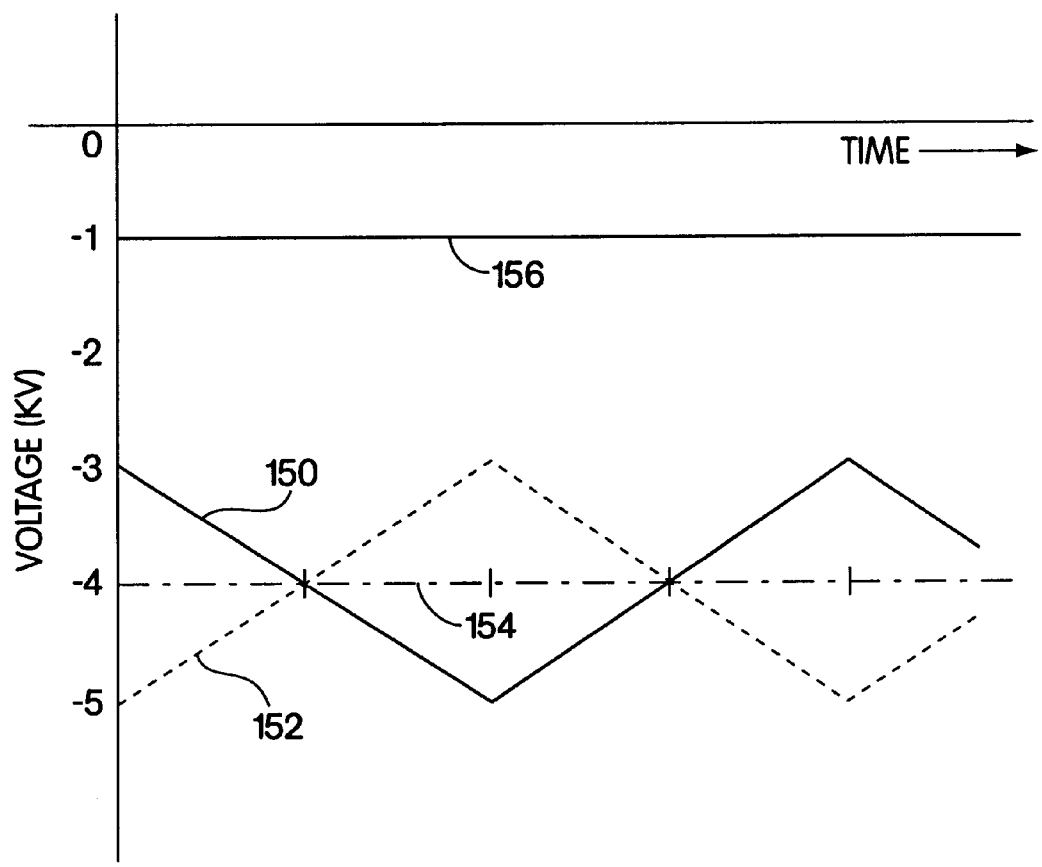
FIG. 3 is a graph showing an example of voltages applied to the scan plates and the postscan electrode of FIG. 2.

The voltages applied to scan plates 40 and 42 and to suppression electrodes 48 and 50 are described with reference to FIG. 3, wherein voltage in kilovolts (kV) is plotted as a function of time. Scan voltages 150 and 152 are output by scan amplifiers 60 and 62 to scan plates 40 and 42, respectively. Scan voltages 150 and 152 each include an AC component and a DC component. In the example of FIG. 3, scan voltages 150 and 152 include AC sawtooth scan waveforms having peak amplitudes of 1 kilovolt. The AC scan waveforms are preferably 180° out of phase and may have a frequency of about 1 kHz. The AC scan waveforms produce AC electric fields between scan plates 40 and 42 that scan ion beam 12 in the X direction.

In accordance with a feature of the invention, scan voltages 150 and 152 have negative DC voltage offsets 154. The DC voltage offsets are the average values of the respective scan waveforms and are preferably equal. Thus, the total scan voltages applied to scan plates 40 and 42 are the sum of the DC voltage offsets and the AC scan waveforms. In the example of FIG. 3, scan voltages 150 and 152 have negative DC voltage offsets of −4 kV. The suppression electrodes 48 and 50 may typically have negative DC bias voltages 156 of −1 kV.

It has been found that application of negative DC voltage offsets to scan plates 40 and 42 produces DC electric fields which focus ion beam 12 in the Y direction, as best shown in FIG. 4. Preferably, the DC voltage offsets 154 of scan voltages 150 and 152 are more negative than the bias voltage 156 applied to postscan suppression electrode 48. For a given ion beam species and energy, the amount of focusing depends on the bias voltage on postscan suppression electrode 48 and the DC voltage offsets on scan plates 40 and 42. As a result, the ion beam has a smaller dimension in the Y direction as it passes between polepieces 100 and 102 of angle corrector 24 than it would have in the absence such focusing. In the absence of beam focusing, the ion beam 12 expands and diverges as it passes through the scanning system, and a portion of the ion beam is likely to strike polepieces 100 and 102. By focusing, transmission of ion beam 12 through angle corrector 24 is increased, and the ion beam current delivered to wafer 34 is increased. Because the ion beam current delivered to the wafer 34 is increased, implant times are decreased. In addition, contamination of wafer 34 caused by sputtering of polepieces 100 and 102 is decreased.

Scan plates 40 and 42 and electrode 48 therefore perform the combined functions of beam scanning in the X direction and beam focusing in the Y direction. These functions are performed with the components previously used for scanning alone and are performed without additional electrodes or power supplies.

The scan voltages applied to scan plates 40 and 42 and the bias voltage applied to suppression electrode 48 may vary, depending on the species and energy of the ions being implanted. The DC voltage offset applied to scan plates 40 and 42 is preferably more negative than the bias voltage applied to suppression electrode 48. The voltage applied to suppression electrode 48 may be in a range of about 0 to −3 kV and is typically about −1 kV. Electrode 48 may be grounded in some applications. The DC voltage offset applied to scan plates 40 and 42 may be in a range of about 0 to −20 kV. Typical DC voltage offsets are in a range of about −2 kV to about −10 kV and preferably differ from the bias voltage applied to suppression electrode 48 by about 1 kV to about 10 kV. It will be understood that these values are given by way of example and are not limiting as to the scope of the invention.

The AC scan waveforms applied to scan plates 40 and 42 may have different amplitudes, frequencies and waveforms. Although a sawtooth scan waveform is typically utilized, the waveform is usually modified to adjust the uniformity of the ion dose applied to the wafer. The amplitude of the AC scan waveform depends on the ion species and energy. By way of example, for a 5 keV boron ion beam, a 2 kV peak-to-peak AC scan waveform and a −2 kV DC voltage offset may be utilized. In this example, suppression electrode 48 is biased at −1 kV.

In an example of a scanner in accordance with the invention, scan plates 40 and 42 have overall lengths a (FIG. 2) in the Z direction of 135 millimeters (mm), parallel plate portions 40a and 42a have a spacing b of 36 mm and lengths in the Z direction of 35 mm, diverging plate portions 40b and 42b diverge from the Z direction at an angle c of 10°, and scan plates 40 and 42 have a height d (FIG. 5) in the Y direction of 140 mm. Aperture 80 in postscan suppression electrode 48 has a width w of 127 mm and a height h of 60 mm. Suppression electrode 48 is spaced from scan plates 40 and 42 by about 10 mm along the Z direction. Voltages in the ranges described above produce scanning of the ion beam 12 in the X direction and focusing of ion beam 12 in the Y direction.

It has been found that the DC voltage offset applied to scan plates 40 and 42 has an effect on the parallelism of beam trajectories in scanned beam 30. However, beam parallelism remains within the specification of 0.7°. Thus, adjustment of the DC voltage offset applied to scan plates 40 and 42 may be used for making small adjustments to the parallelism of trajectories in scanned beam 30.

Table 1 illustrates the effect of DC voltage offset on beam current and parallelism for 5 keV boron. Suppression electrode 48 was maintained at a voltage of −1 kV. Negative parallelism angles indicate beams that are slightly converging, while positive angles indicate beams that are slightly diverging. It is important to note that: (1) the best parallelism and the largest beam currents are achieved at slightly different values of DC voltage offset, and (2) the beam parallelism is well within the specification of 0.7 degrees over a wide range of DC voltage offsets.

TABLE 1

EFFECT OF OFFSET ON PARALLELISM AND BEAM CURRENT - 5 keV BORON

| Offset (kV) | Parallelism (deg) | 300 mm Current (μA) |
|---|---|---|
| 0.0 | 0.33 | 98 |
| −0.5 | 0.14 | 104 |
| −1.0 | 0.02 | 140 |

TABLE 1-continued

EFFECT OF OFFSET ON PARALLELISM AND
BEAM CURRENT - 5 keV BORON

| Offset (kV) | Parallelism (deg) | 300 mm Current (µA) |
|---|---|---|
| −1.5 | 0.03 | 206 |
| −2.0 | −0.14 | 246 |

Figure 7:
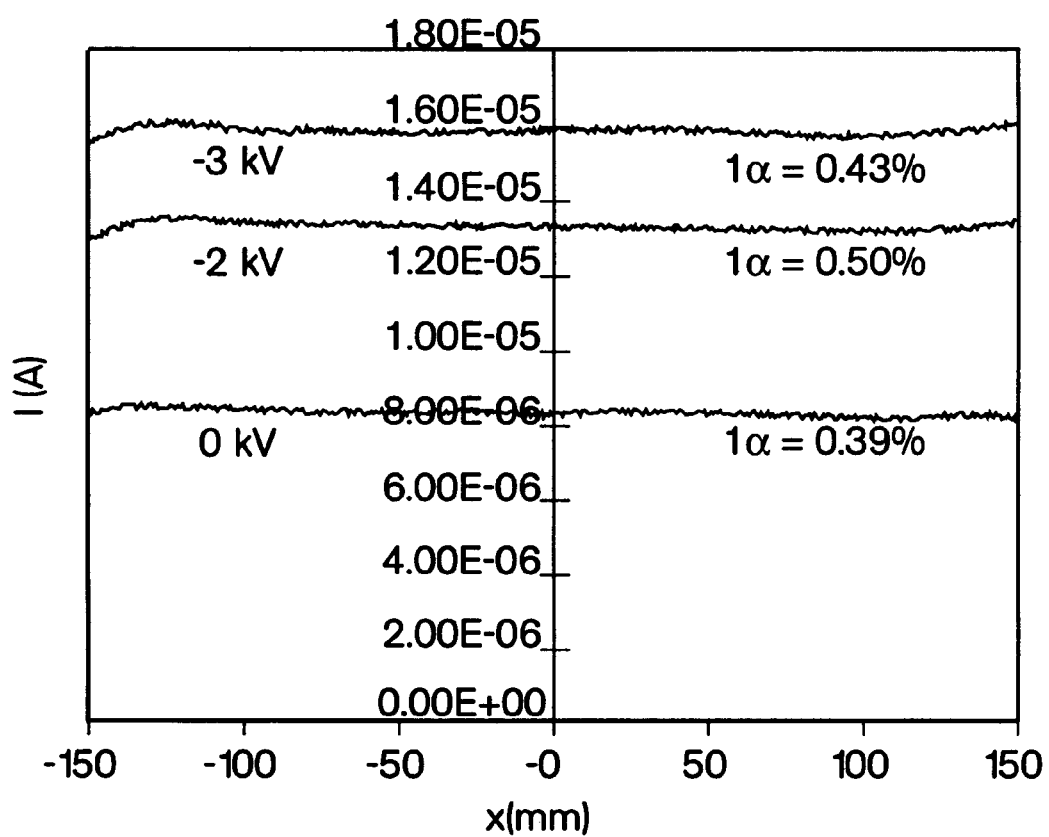
FIG. 7 is a graph of measured ion beam current as a function of radial position on a 300 millimeter wafer, for different voltage offsets on the scan plates.

FIG. 7 illustrates the effect of DC voltage offsets on low energy beam current, specifically 20 keV phosphorus. Current measured by a Faraday profiler in amps is plotted as a function of radial position on a 300 millimeter wafer. Uniformity was set up three times, using 0 kV, −2 kV and −3 kV as the DC voltage offsets. Suppression electrode 48 was maintained at a voltage of −1 kV. Integrated beam currents for the three setups were 0.81 milliamp at 0 kV offset, 1.25 milliamps at −2 kV offset and 1.50 milliamps at −3 kV offset.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for controlling a charged particle beam, comprising:
    a charged particle beam source for generating a charged particle beam;
    scan electrodes disposed on opposite sides of the charged particle beam;
    a postscan electrode disposed adjacent to the charged particle beam and downstream of said scan electrodes, said postscan electrode having a postscan voltage; and
    a scan voltage generator for applying to said scan electrodes scan voltages for scanning the charged particle beam in a first direction, said scan voltages having negative DC voltage offsets, wherein the charged particle beam is focused in a second direction orthogonal to said first direction.

2. Apparatus as defined in claim 1 wherein said scan electrodes comprise first and second scan plates positioned on opposite sides of the charged particle beam in said first direction.

3. Apparatus as defined in claim 2 wherein said scan plates comprise parallel portions and diverging portions downstream of said parallel portions.

4. Apparatus as defined in claim 1 wherein said postscan electrode comprises first and second electrode portions positioned on opposite sides of the charged particle beam in said second direction.

5. Apparatus as defined in claim 4 wherein said postscan electrode defines a generally rectangular opening having a long dimension parallel to said first direction.

6. Apparatus as defined in claim 1 wherein said scan voltages comprise sawtooth waveforms for scanning the charged particle beam, said sawtooth waveforms having negative DC voltage offsets.

7. Apparatus as defined in claim 1 wherein said scan voltage generator comprises a scan generator for generating phased scan voltages and first and second scan amplifiers for amplifying said phased scan voltages and for applying the amplified scan voltages to said scan electrodes.

8. Apparatus as defined in claim 1 wherein the DC voltage offsets of said scan voltages are more negative than said postscan voltage.

9. Apparatus as defined in claim 8 wherein said postscan voltage and the DC voltage offsets of said scan voltages differ by about 1 kilovolt to about 10 kilovolts.

10. Apparatus as defined in claim 1 further comprising means for adjusting the DC voltage offsets of said scan voltages as the energy of said charged particle beam is changed.

11. Apparatus as defined in claim 1 further comprising an angle corrector disposed downstream of said postscan electrode for converting the scanned charged particle beam into substantially parallel trajectories and means for adjusting the DC voltage offsets of said scan voltages, wherein the parallelism of said trajectories is adjusted.

12. Apparatus as defined in claim 1 further comprising a postscan suppression voltage generator for applying said postscan voltage to said postscan electrode, said postscan voltage being selected to suppress migration of electrons from the charged particle beam toward said scan electrodes.

13. Apparatus as defined in claim 1 further comprising a prescan suppression electrode disposed adjacent to the charged particle beam and upstream of said scan electrodes, and a prescan suppression voltage generator for applying to said prescan suppression electrode a prescan suppression voltage selected to suppress migration of electrons from the charged particle beam toward said scan electrodes.

14. Apparatus as defined in claim 1 wherein said charged particle beam comprises an ion beam.

15. A method for controlling a charged particle beam, comprising the steps of:
    generating a charged particle beam;
    positioning scan electrodes on opposite sides of the charged particle beam;
    positioning a postscan electrode adjacent to the charged particle beam and downstream of said scan electrodes;
    applying to said postscan electrode a postscan voltage; and
    applying to said scan electrodes scan voltages for scanning the charged particle beam in a first direction, said scan voltages having negative DC voltage offsets, wherein the charged particle beam is focused in a second direction orthogonal to said first direction.

16. A method for controlling a charged particle beam as defined in claim 15 further comprising the step of adjusting the DC voltage offsets of said scan voltages based on the energy and species of said charged particle beam.

17. A method for controlling a charged particle beam as defined in claim 15 wherein the step of applying scan voltages comprises applying sawtooth scan waveforms for scanning the charged particle beam in said first direction, said sawtooth scan waveforms having negative DC voltage offsets.

18. A method for controlling a charged particle beam as defined in claim 15 wherein the step of applying scan voltages comprises generating phased scan voltages, amplifying said phased scan voltages and applying the amplified scan voltages to said scan electrodes.

19. A method for controlling a charged particle beam as defined in claim 15 further comprising the steps of converting the scanned charged particle beam into substantially parallel trajectories, and adjusting the DC voltage offsets of said scan voltages, wherein the parallelism of said trajectories is adjusted.

20. A method for controlling a charged particle beam as defined in claim 15 wherein the step of applying scan voltages comprises applying DC voltage offsets that are more negative than said postscan voltage.

21. Apparatus for scanning and focusing an ion beam, comprising:

an ion beam generator for generating an ion beam;

scan plates disposed on opposite sides of the ion beam;

a postscan electrode disposed adjacent to the ion beam and downstream of said scan plates;

a postscan voltage generator for applying to a postscan voltage said postscan electrode; and a scan voltage generator for applying to scan plates scan voltages for scanning the ion beam in a first direction, said scan voltages having negative DC voltage offsets, wherein the ion beam is focused in a second direction orthogonal to said first direction.

22. Apparatus as defined in claim 21 wherein said scan voltages comprise sawtooth scan waveforms for scanning the ion beam in said first direction, said sawtooth scan waveforms having negative DC voltage offsets.

23. Apparatus as defined in claim 21 wherein the DC voltage offsets of said scan voltages are more negative than said postscan voltage.

24. Apparatus as defined in claim 23 wherein said postscan voltage and the DC voltage offsets of said scan voltages differ by about 1 kilovolt to about 10 kilovolts.

25. Apparatus as defined in claim 21 further comprising means for adjusting the DC voltage offsets of said scan voltages as the energy of said ion beam is changed.

26. Apparatus as defined in claim 21 wherein said postscan voltage is selected to suppress migration of electrons from the ion beam toward said scan plates.

27. Apparatus as defined in claim 21 further comprising a prescan suppression electrode disposed adjacent to the ion beam and upstream of said scan plates, and a prescan suppression voltage generator for applying to said prescan suppression electrode a prescan suppression voltage selected to suppress migration of electrons from the ion beam toward said scan plates.

* * * * *